United States Patent
Jeong et al.

(10) Patent No.: US 8,119,478 B2
(45) Date of Patent: Feb. 21, 2012

(54) MULTI-BIT PHASE-CHANGE RANDOM ACCESS MEMORY (PRAM) WITH DIAMETER-CONTROLLED CONTACTS AND METHODS OF FABRICATING AND PROGRAMMING THE SAME

(75) Inventors: Won-Cheol Jeong, Seoul (KR); Hyeong-Jun Kim, Seoul (KR); Se-Ho Lee, Seoul (KR); Jae-Hyun Park, Yongin-si (KR); Chang-Wook Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/640,567

(22) Filed: Dec. 17, 2009

(65) Prior Publication Data

US 2010/0090194 A1    Apr. 15, 2010

Related U.S. Application Data

(62) Division of application No. 11/586,820, filed on Oct. 26, 2006, now abandoned.

(30) Foreign Application Priority Data

Jan. 2, 2006    (KR) .................. 10-2006-0000265

(51) Int. Cl.
  *H01L 21/336*    (2006.01)
(52) U.S. Cl. ........................................ 438/257
(58) Field of Classification Search ............ 438/257
  See application file for complete search history.

(56) References Cited

U.S. PATENT DOCUMENTS 5,687,112 A    11/1997    Ovshinsky
6,800,563 B2 *  10/2004    Xu ................................ 438/718
6,806,528 B2    10/2004    Lee et al.
7,061,013 B2    6/2006     Hideki
(Continued)

FOREIGN PATENT DOCUMENTS

KR    10-2004-0022275 A    3/2004
(Continued)

OTHER PUBLICATIONS

Itri, A., et al., "Analysis of Phase-Transformation Dynamics and Estimation of Amorphous-Chalcogenide Fraction in Phase-Change Memories," IEEE 04CH37533 42nd Annual International Reliability Physics Symposium, Phoenix, pp. 209-215, 2004.

(Continued)

*Primary Examiner* — David Vu
*Assistant Examiner* — Brandon Fox
(74) *Attorney, Agent, or Firm* — Onello & Mello, LLP (57) ABSTRACT

A phase-change random-access memory (PRAM) device includes a chalcogenide element, the chalcogenide element comprising a material which can assume a crystalline state or an amorphous state upon application of a heating current. A first contact is connected to a first region of the chalcogenide element and has a first cross-sectional area. A second contact is connected to a second region of the chalcogenide element and having a second cross-sectional area. A first programmable volume of the chalcogenide material is defined in the first region of the chalcogenide element, a state of the first programmable volume being programmable according to a resistance associated with the first contact. A second programmable volume of the chalcogenide material is defined in the second region of the chalcogenide element, a state of the second programmable volume being programmable according to a second resistance associated with the second contact.

19 Claims, 10 Drawing Sheets

U.S. PATENT DOCUMENTS

| | | |
|---|---|---|
| 7,488,968 B2 | 2/2009 | Lee |
| 2004/0042316 A1 | 3/2004 | Lee et al. |
| 2004/0178404 A1 | 9/2004 | Ovshinsky |
| 2005/0051901 A1 | 3/2005 | Chen |
| 2005/0112896 A1* | 5/2005 | Hamann et al. ............... 438/694 |
| 2005/0245030 A1 | 11/2005 | Ha et al. |
| 2006/0077741 A1* | 4/2006 | Wang et al. ................... 365/222 |
| 2007/0096074 A1* | 5/2007 | Asano et al. ...................... 257/4 |
| 2007/0096248 A1 | 5/2007 | Philipp et al. |
| 2007/0111440 A1 | 5/2007 | An et al. |
| 2007/0148862 A1 | 6/2007 | Chen et al. |
| 2007/0155093 A1 | 7/2007 | Jeong |
| 2008/0121862 A1* | 5/2008 | Liu .................................. 257/4 |

FOREIGN PATENT DOCUMENTS

| | | |
|---|---|---|
| KR | 10-2005-0033340 A | 4/2005 |
| KR | 10-2005-0059855 A | 6/2005 |
| KR | 10-2005-0111469 A | 11/2005 |

OTHER PUBLICATIONS

Application and prosecution history of U.S. Appl. No. 11/586,820, filed Oct. 26, 2006, by Won-Cheol Jeong, et al., entitled "Multi-Bit Phase-Change Random Access Memory (PRAM) With Diameter-Controlled Contacts and Methods of Fabricating and Programming the Same", which is stored in the United States Patent and Trademark Office (USPTO) Image File wrapper (IFW) system.

* cited by examiner

FIG. 1

(Prior Art)

MULTI-BIT PHASE-CHANGE RANDOM ACCESS MEMORY (PRAM) WITH DIAMETER-CONTROLLED CONTACTS AND METHODS OF FABRICATING AND PROGRAMMING THE SAME

RELATED APPLICATIONS

This application is a divisional application of U.S. patent application Ser. No. 11/586,820, filed on Oct. 26, 2006, which claims the benefit of Korean patent application number 10-2006-0000265, filed on Jan. 2, 2006, in the Korean Intellectual Property Office, the contents of which applications are incorporated herein their entirety by reference.

FIELD OF THE INVENTION

The invention relates to a phase-change random access memory (PRAM) and methods of fabricating and programming the same, and, more particularly, to a PRAM having contacts with controlled diameters and methods of fabricating and programming the same.

BACKGROUND OF THE INVENTION

Phase change memory devices have recently been developed. The phase change memory device has a nonvolatile property of maintaining stored data when its power supply is interrupted. A unit cell of the phase change memory device uses a phase change material as a data storing medium. The phase change material has two stable states, namely, an amorphous state and a crystalline state, which is controlled by heat provided to the cell structure by an applied current. A generally-known phase change, or chalcogenide, material is a compound of Ge, Sb and Te, commonly referred to as a GST material (Ge—Sb—Te). Specifically, one type of GST material is $Ge_2Sb_2Te_5$.

When the GST material is heated for a short time at a temperature close to a melting point of the material and is then quickly cooled or quenched, the GST material is in its amorphous state. If the GST is heated for a long time at a crystallization temperature lower than the melting point and slowly cooled, the GST is in its crystalline state. The amorphous GST has a higher specific resistance than the crystalline GST.

Therefore, whether the information stored in the phase change memory cell is logical '1' or '0' can be determined by sensing an amount of current flowing through the phase change material.

Joule heat is used as the heat supplied to the phase change material. That is, when the current is supplied to an electrode connected to the phase change material, Joule heat is generated from the electrode and supplied to the phase change material. The temperature of the heat supplied to the phase change material is dependent upon the amount of the supplied current.

Figure 1:
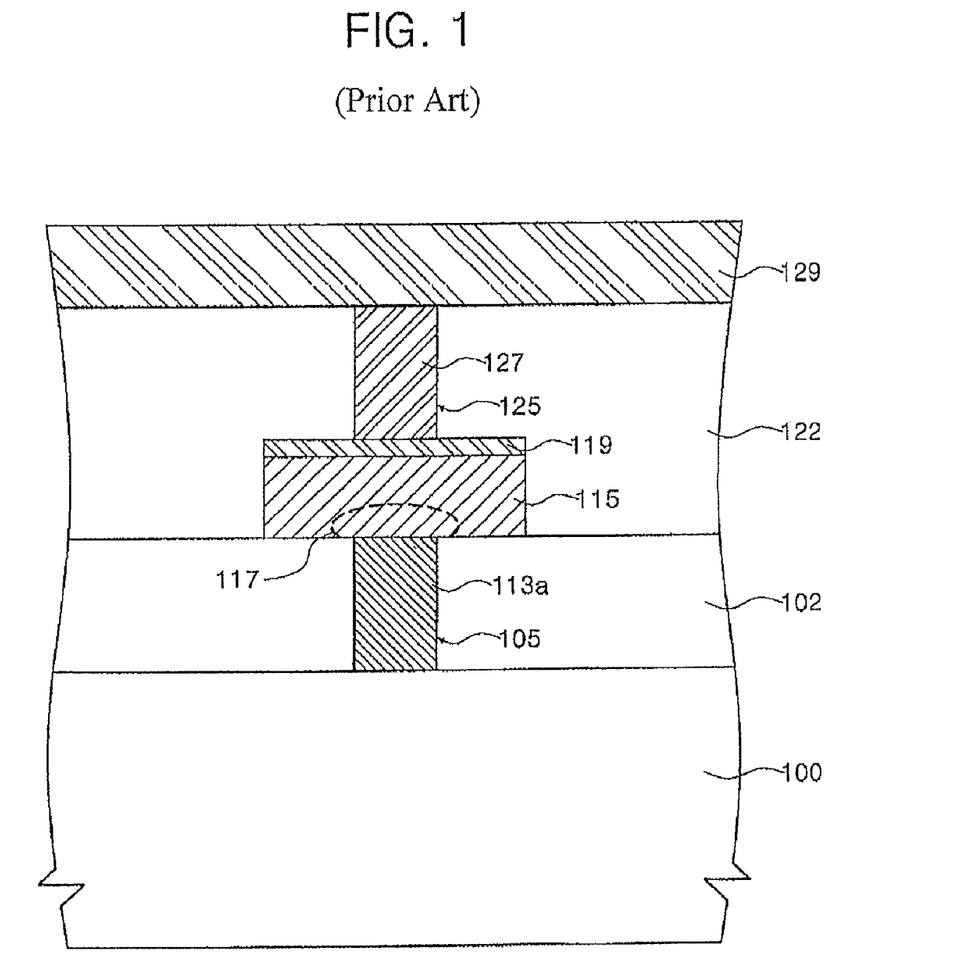
FIG. 1 is a cross-sectional diagram illustrating the structure of a conventional phase change memory cell.

FIG. 1 is a cross-sectional diagram illustrating the structure of a conventional phase change memory cell. Referring to FIG. 1, a lower insulating layer 102 is formed on a semiconductor substrate. An upper insulating layer 122 is formed on the lower insulating layer 102. A first contact hole 105 is formed through the lower insulating layer 102, and a second contact hole 125 is formed in the upper insulating layer 122. The second contact hole 125 contains a conductive upper or top contact plug 127 made of a conductive material such as tungsten (W), aluminum (Al) or copper (Cu). The first contact hole 105 contains a conductive lower or bottom contact plug and heater 113a made of a conductive material such as TiAlN, TiN, or like material.

A layer of chalcogenide GST phase change material 115 is formed in the upper insulating layer 122 on the lower insulating layer 102. A conductive upper electrode 119, made of a material such as TiN, TaN, WN or similar material, is formed on the top surface of the GST phase change material 115. The phase change material 115 is electrically connected at its bottom surface to the lower plug or heater 113a and is electrically connected at its top surface to the upper electrode 119 and the upper contact plug 127. A conductive metal pattern 129, made of a conductive material such as W, Al, Cu, or similar material, is connected to the upper contact plug 127 and the upper electrode 119.

When the memory cell is programmed, a current is applied to the structure between the metal pattern 129 and the bottom contact and heater 113 a. As the current passes through the heater 113a, the resulting heat affects the state of the GST material 115 in a programmable volume or region 117. Depending on the programming process applied, the GST material in the programmable volume 117 takes on a crystalline state or an amorphous state. For example, to program the programmable volume to the crystalline state, the GST material can be heated to approximately 150 degrees C. by passing a current of approximately 0.56 mA through the material and allowing it to cool for approximately 500 ns. For example, to program the programmable volume to the amorphous state, the GST material can be heated to approximately 620 degrees C. by passing a current of approximately 1.2 mA through the material and allowing it to cool for approximately 4-5 ns.

Figure 2A:
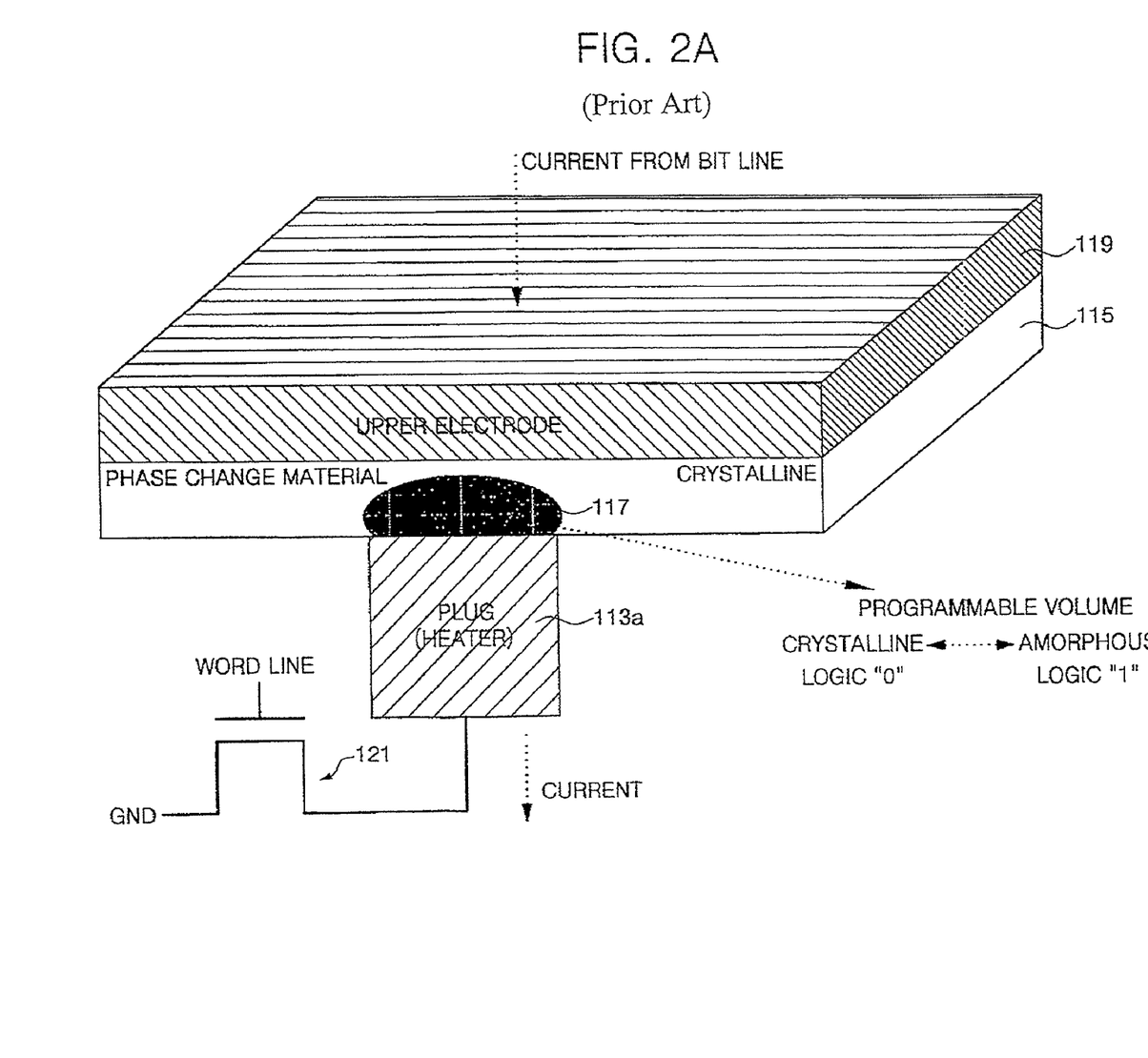
FIG. 2A contains a schematic diagram of the memory cell of FIG. 1.
Figure 2B:
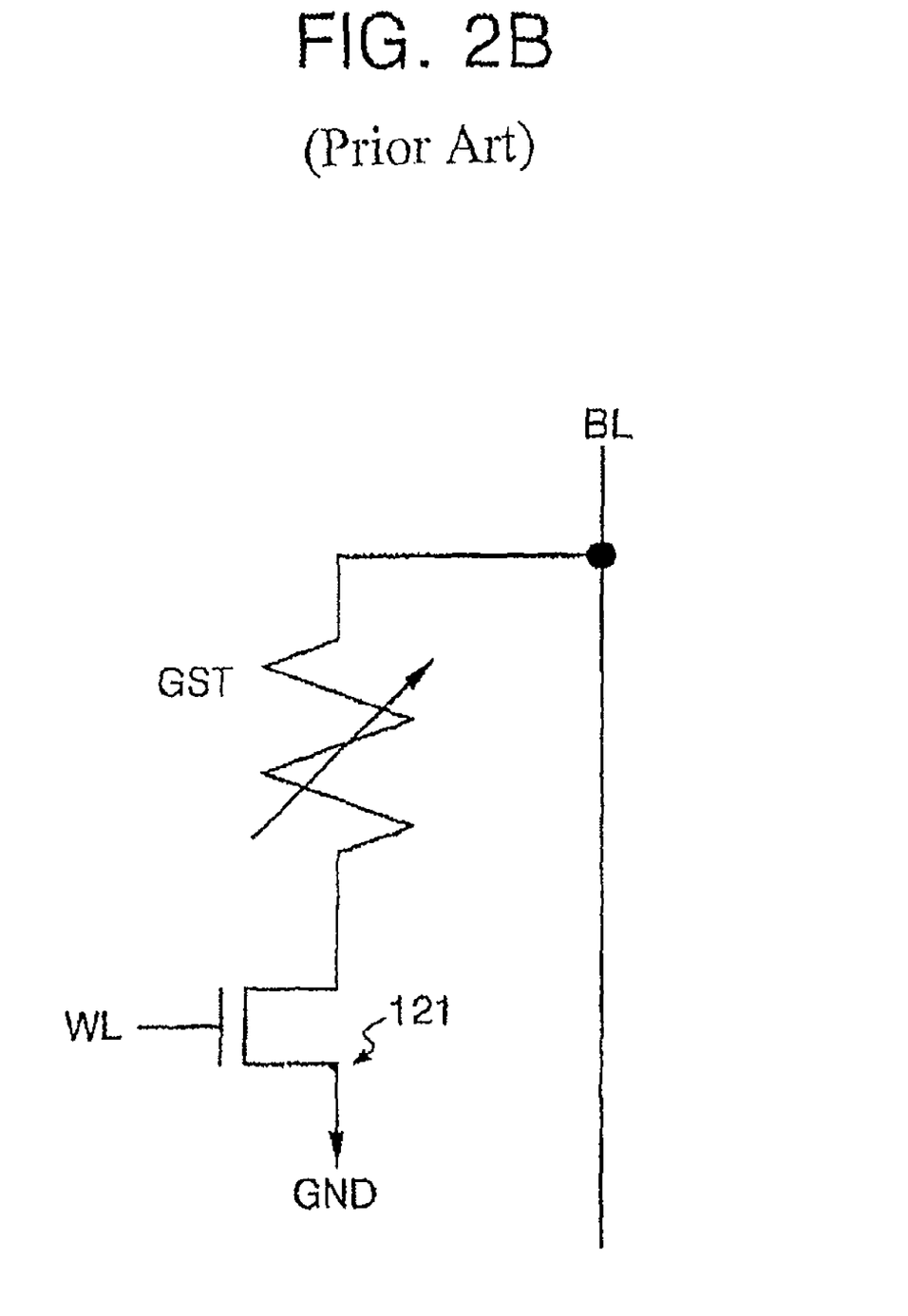
FIG. 2B is an equivalent schematic circuit diagram of a circuit in which the memory cell of FIG. 1 is used.

FIG. 2A contains a schematic diagram of the memory cell of FIG. 1, and FIG. 2B is an equivalent schematic circuit diagram of a circuit in which the memory cell of FIG. 1 is used. Referring to FIGS. 2A and 2B, current from a bit line BL passes through the upper electrode 119 and the GST phase change material 115 to program the programmable volume 117 to the desired state. The GST phase change material 115 is indicated as a variable resistance. A word line is used to control a transistor 121 to enable the programming process. Current through the heater 113a heats the GST phase change material 115 to program the programmable volume 117 to the desired state. In one example configuration, the memory cell is programmed to a logic 0 state when the programmable volume 117 is in the amorphous state and the memory cell is programmed to a logic 1 state when the programmable volume 117 is in the crystalline state.

The memory cell described above can save one of two possible states, namely, a logic 0 state or a logic 1 state. In general, it is beneficial to create a multi-bit memory cell which can store one of more than two possible states to increase the data storage capacity of the memory. A multi-bit PRAM has been developed which uses hybrid states of the programmable volume to store more than one bit of information in a cell. In general, the programmable volume can be programmed to one of three possible states. In a first state, referred to as a fully reset state, the entire programmable volume is programmed to the amorphous state. In a second state, referred to as a fully set state, the entire programmable volume is programmed to the crystalline state. In a third state, part of the programmable volume is programmed to the crystalline state, and another part of the programmable volume is programmed to the amorphous state.

In this type of hybrid device, the volume fraction X of the programmable volume, i.e., the fraction of the programmable volume in the amorphous state, is controlled by controlling the magnitude of the programming current and/or the quenching time used after the programming current is removed. In general, the volume fraction X is a number between 0 and 1. In the fully reset state, X=1, and, in the fully set state, X=0. In the hybrid or mixed state, X is between 0 and 1, i.e., 0<X<1. Hence, theoretically, the hybrid memory cell can store three possible values. In practice, however, this type of device is very difficult to program. The volume fraction cannot be accurately controlled through the programming process, resulting in very high programming error and, as a result, very low programming reliability.

SUMMARY OF THE INVENTION

According to a first aspect, the present invention is directed to a phase-change random-access memory (PRAM) device. The device includes a chalcogenide element, the chalcogenide element comprising a material which can assume a crystalline state or an amorphous state upon application of a heating current. A first contact is connected to a first region of the chalcogenide element and has a first cross-sectional area. A second contact is connected to a second region of the chalcogenide element and has a second cross-sectional area. A first programmable volume of the chalcogenide material is defined in the first region of the chalcogenide element, a state of the first programmable volume being programmable according to a resistance associated with the first contact. A second programmable volume of the chalcogenide material is defined in the second region of the chalcogenide element, a state of the second programmable volume being programmable according to a second resistance associated with the second contact.

In one embodiment, a resistivity of a material of which the first contact is formed is different from that of a material of which the second contact is formed.

In one embodiment, a resistivity of a material of which the first contact is formed is substantially the same as a material of which the second contact is formed.

In one embodiment, the first and second contacts are made of different materials.

In one embodiment, the first and second contacts are made of substantially the same materials.

In one embodiment, the PRAM device further comprises a second chalcogenide element, the second chalcogenide element comprising a third programmable volume defined in a third region of the second chalcogenide element. One of the first and second contacts can be connected to the third region of the second chalcogenide element, a state of the third programmable volume being programmable according to the resistance associated with the one of the first and second contacts connected to the third region. A resistivity of a material of which the first contact is formed can be different from that of a material of which the second contact is formed. The first and second contacts can be made of different materials. At least one of the first and second contacts can have more than one cross-sectional area. At least one of the first and second contacts can have a tapered shape. A resistivity of a material of which the first contact is formed can be different from that of a material from which the second contact is formed. The first and second contacts can be made of different materials. In one embodiment, the PRAM device further comprises a third contact having a third cross-sectional area and being connected to a fourth region of the second chalcogenide element, the fourth region of the second chalcogenide element comprising a fourth programmable volume, a state of the fourth programmable volume being programmable according to a resistance associated with the third contact connected to the fourth region. The third cross-sectional area can be the same as one of the first and second cross-sectional areas. The third cross-sectional area can be different than one of the first and second cross-sectional areas. A resistivity of a material of which the third contact is formed can be different from that of a material of which at least one of the first and second contacts is formed. The third contact and at least one of the first and second contacts can be made of different materials. The third contact can have more than one cross-sectional area. The third contact can have a tapered shape.

In one embodiment, the PRAM device can store data that can have one of more than two values.

According to another aspect, the invention is directed to a phase-change random-access memory (PRAM) device. The PRAM device includes a chalcogenide element, the chalcogenide element comprising a material which can assume a crystalline state or an amorphous state upon application of a heating current. A first contact is connected to a first region of the chalcogenide element and has a first cross-sectional area. A second contact is connected to a second region of the chalcogenide element and has a second cross-sectional area different than the first cross-sectional area. A first programmable volume of the chalcogenide material is defined in the first region of the chalcogenide element, a state of the first programmable volume being programmable according to a resistance associated with the first contact. A second programmable volume of the chalcogenide material is defined in the second region of the chalcogenide element, a state of the second programmable volume being programmable according to a second resistance associated with the second contact.

In one embodiment, a resistivity of a material of which the first contact is formed is different from that of a material from which the second contact is formed. In one embodiment, the first and second contacts are made of different materials. In one embodiment, the PRAM device further comprises a second chalcogenide element, the second chalcogenide element comprising a third programmable volume defined in a third region of the second chalcogenide element. One of the first and second contacts can be connected to the third region of the second chalcogenide element, a state of the third programmable volume being programmable according to the resistance associated with the one of the first and second contacts connected to the third region. A resistivity of a material of which the first contact is formed can be different from that of a material from which the second contact is formed. The first and second contacts can be made of different materials. At least one of the first and second contacts can have more than one cross-sectional area. At least one of the first and second contacts can have a tapered shape.

In one embodiment, the PRAM device further comprises a third contact having a third cross-sectional area being connected to a fourth region of the second chalcogenide element, the fourth region of the second chalcogenide element comprising a fourth programmable volume, a state of the fourth programmable volume being programmable according to a resistance associated with the third contact connected to the fourth region. The third cross-sectional area can be the same as one of the first and second cross-sectional areas. The third cross-sectional area can be different than one of the first and second cross-sectional areas. A resistivity of a material of which the third contact is formed can be different from that of a material of which at least one of the first and second contacts is formed. The third contact and at least one of the first and second contacts can be made of different materials. The third contact can have more than one cross-sectional area. The third contact can have a tapered shape.

The PRAM device can store data that can have one of more than two values. According to another aspect, the invention is directed to a phase-change random-access memory (PRAM) device. The PRAM device includes a chalcogenide element, the chalcogenide element comprising a material which can assume a crystalline state or an amorphous state upon application of a heating current. A first contact is connected to a first region of the chalcogenide element and has a first cross-sectional area. A second contact is connected to a second region of the chalcogenide element and has a second cross-sectional area substantially the same as the first cross-sectional area. A first programmable volume of the chalcogenide material is defined in the first region of the chalcogenide element, a state of the first programmable volume being programmable according to a resistance associated with the first contact. A second programmable volume of the chalcogenide material is defined in the second region of the chalcogenide element, a state of the second programmable volume being programmable according to a second resistance associated with the second contact.

A resistivity of a material of which the first contact is formed can be different from that of a material from which the second contact is formed. The first and second contacts can be made of different materials. In one embodiment, the PRAM device further includes a second chalcogenide element, the second chalcogenide element comprising a third programmable volume defined in a third region of the second chalcogenide element. One of the first and second contacts can be connected to the third region of the second chalcogenide element, a state of the third programmable volume being programmable according to the resistance associated with the one of the first and second contacts connected to the third region. A resistivity of a material of which the first contact is formed can be different from that of a material from which the second contact is formed. The first and second contacts can be made of different materials. At least one of the first and second contacts can have more than one cross-sectional area. At least one of the first and second contacts can have a tapered shape.

In one embodiment, the PRAM device further comprises a third contact having a third cross-sectional area and being connected to a fourth region of the second chalcogenide element, the fourth region of the second chalcogenide element comprising a fourth programmable volume, a state of the fourth programmable volume being programmable according to a resistance associated with the third contact connected to the fourth region. The third cross-sectional area can be the same as one of the first and second cross-sectional areas. The third cross-sectional area can be different than one of the first and second cross-sectional areas. A resistivity of a material of which the third contact is formed can be different from that of a material of which at least one of the first and second contacts is formed. The third contact and at least one of the first and second contacts can be made of different materials. The third contact can have more than one cross-sectional area. The third contact can have a tapered shape.

In one embodiment, the PRAM device can store data that can have one of more than two values.

According to another aspect, the invention is directed to a method of making a phase-change random-access memory (PRAM) device. According to the method, a chalcogenide element is provide, the chalcogenide element comprising a material which can assume a crystalline state or an amorphous state upon application of a heating current. A first contact is formed connected to a first region of the chalcogenide element and having a first cross-sectional area. A second contact is formed connected to a second region of the chalcogenide element and having a second cross-sectional area. A first programmable volume of the chalcogenide material is defined in the first region of the chalcogenide element, a state of the first programmable volume being programmable according to a resistance associated with the first contact. A second programmable volume of the chalcogenide material is defined in the second region of the chalcogenide element, a state of the second programmable volume being programmable according to a second resistance associated with the second contact.

In one embodiment, the first and second cross-sectional areas are substantially the same. The first and second cross-sectional areas can be different.

In one embodiment, a resistivity of a material of which the first contact is formed is different from that of a material of which the second contact is formed.

In one embodiment, a resistivity of a material of which the first contact is formed is substantially the same as a material of which the second contact is formed.

In one embodiment, the first and second contacts are made of different materials.

In one embodiment, the first and second contacts are made of substantially the same materials.

In one embodiment, the method further comprises forming a second chalcogenide element, the second chalcogenide element comprising a third programmable volume defined in a third region of the second chalcogenide element.

In one embodiment, one of the first and second contacts is connected to the third region of the second chalcogenide element, a state of the third programmable volume being programmable according to the resistance associated with the one of the first and second contacts connected to the third region. In one embodiment, a resistivity of a material of which the first contact is formed is different from that of a material of which the second contact is formed. In one embodiment, the first and second contacts are made of different materials. In one embodiment, at least one of the first and second contacts is formed to have more than one cross-sectional area. In one embodiment, at least one of the first and second contacts is formed to have a tapered shape. In one embodiment, a resistivity of a material of which the first contact is formed is different from that of a material from which the second contact is formed. In one embodiment, the first and second contacts are made of different materials. In one embodiment, the method further comprises forming a third contact having a third cross-sectional area and being connected to a fourth region of the second chalcogenide element, the fourth region of the second chalcogenide element comprising a fourth programmable volume, a state of the fourth programmable volume being programmable according to a resistance associated with the third contact connected to the fourth region. The third cross-sectional area can be the same as one of the first and second cross-sectional areas. The third cross-sectional area can be different than one of the first and second cross-sectional areas. In one embodiment, a resistivity of a material of which the third contact is formed is different from that of a material of which at least one of the first and second contacts is formed. In one embodiment, the third contact and at least one of the first and second contacts are made of different materials. The third contact can be formed to have more than one cross-sectional area. In one embodiment, the third contact is formed to have a tapered shape.

In one embodiment, the PRAM device can store data that can have one of more than two values.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS OF THE INVENTION

A semiconductor device and method according to the present invention will now be described more fully hereinafter with reference to the accompanying drawings, in which exemplary embodiments of the invention are shown. It should be noted that, throughout the description, unless noted otherwise, when a layer is described as being formed on another layer or on a substrate, the layer may be formed directly on the other layer or on the substrate, or one or more layers may be interposed between the layer and the other layer or the substrate.

Figure 3:
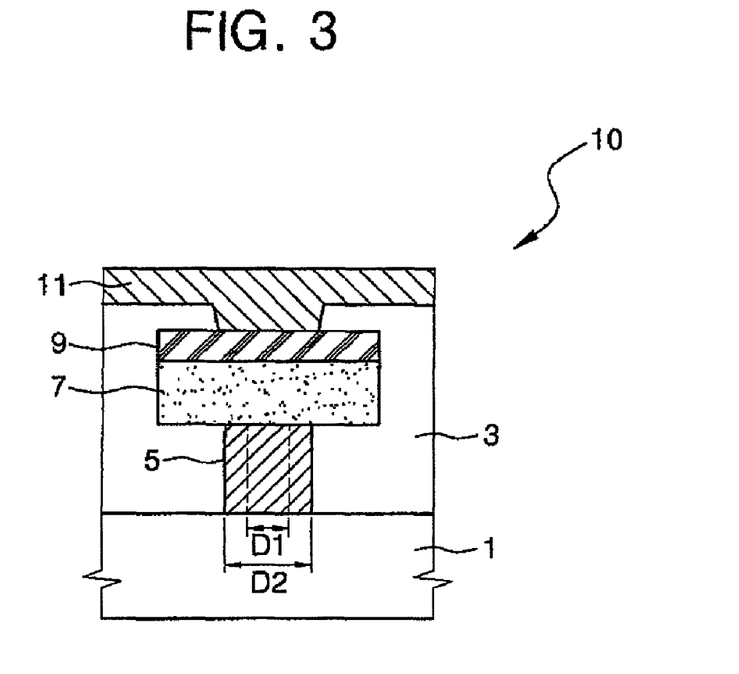
FIG. 3 contains a schematic cross-sectional view of an embodiment of a PRAM memory cell illustrating a bottom contact or heater in two cases in which the bottom contact or heater has one of two possible cross-sectional areas, according to the invention.

In general, the cross-sectional area of the bottom contact or heater has an effect on the programming process applied to program the programmable volume to the desired state. FIG. 3 contains a schematic cross-sectional view of a PRAM memory cell 10 illustrating a bottom contact or heater 5 in two cases in which the bottom contact or heater has one of two possible cross-sectional areas. The memory cell 10 of FIG. 3 includes a substrate 1 on which is formed an insulating layer 3. An upper metal pattern 11 is formed on the insulating layer 3. The chalcogenide GST phase change material 7 is formed in the insulating layer 3 such that its bottom surface is in contact with the bottom contact 5. The top electrode 9 is formed on top of the top surface of the GST phase change material 7, in contact with the GST phase change material 7 and the upper metal pattern 11. As illustrated in FIG. 3, the bottom contact can have one of two possible cross-sectional areas for purposes of illustrating and describing the invention. The two possible cross-sectional areas are defined by the two possible diameters D1 and D2 that the bottom contact 5 can have.

Figure 4:
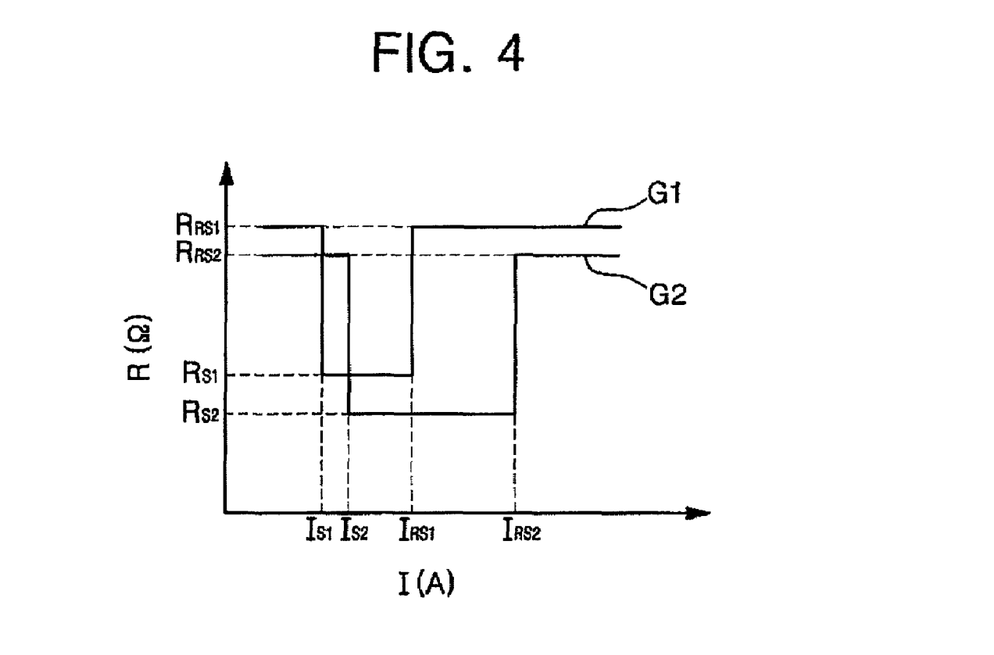
FIG. 4 contains a schematic waveform diagram illustrating the current-resistance (I-R) characteristics for the two cases of the PRAM memory cell illustrated in FIG. 3.

FIG. 4 contains a schematic waveform diagram illustrating the current-resistance (I-R) characteristics for the two cases of the PRAM memory cell 10 illustrated in FIG. 3. The waveforms of FIG. 4 illustrate the programming of the memory cell 10 of FIG. 3 under the two conditions of bottom contact cross-sectional area. Specifically, the curve labeled G1 illustrates programming for the memory cell 10 having the bottom contact with diameter D1, and the curve labeled G2 illustrates programming for the memory cell 10 having the bottom contact with diameter D2.

As noted in waveform G1 of FIG. 4, when the cell having the bottom contact with the smaller cross-sectional area is in the reset state, the programmable volume is in the amorphous state, and the resistance $R_{RS1}$ of the cell is comparatively high. With a set current $I_{S1}$ applied, the cell enters the set state in which the programmable volume enters the crystalline state, and the resistance $R_{S1}$ of the cell in the set state drops substantially. While in the set state, if the reset current $I_{RS1}$ is applied, the cell enters the reset state in which the programmable volume is in the amorphous state, such that the resistance of the cell returns to the reset resistance value $R_{RS1}$.

As noted in waveform G2 of FIG. 4, when the cell having the bottom contact with the larger cross-sectional area is in the reset state, the programmable volume is in the amorphous state, and the resistance $R_{RS2}$ of the cell is comparatively high, but is lower than the reset resistance $R_{RS1}$ of the cell with the bottom contact having the smaller cross-sectional area. With a set current $I_{S2}$ applied, the cell enters the set state in which the programmable volume enters the crystalline state, and the resistance $R_{S2}$ of the cell in the set state drops substantially, to a value lower than the set resistance $R_{S1}$ of the cell having the bottom contact with the smaller cross-sectional area. While in the set state, if the reset current $I_{RS2}$ is applied, the cell enters the reset state in which the programmable volume is in the amorphous state, such that the resistance of the cell returns to the reset resistance value $R_{RS2}$.

As shown in FIG. 4, because of the difference in cross-sectional area of the bottom contacts of the two exemplary memory cells, the resistance of the cell is different for the cells in both the reset state and the set state. The cell having the bottom contact with the larger cross-sectional area has both a lower reset resistance and set resistance than the cell with the bottom contact with the smaller cross-sectional area. It is also noted that, because of the difference in cell resistance between the two cells, both the set current and reset current for the two cells are different. Specifically, the set current $I_{R2}$ of the cell with the larger bottom contact is higher than the set current $I_{S1}$ of the cell with the smaller bottom contact. Also, the reset current $I_{RS2}$ of the cell with the larger bottom contact is higher than the reset current $I_{RS1}$ of the cell with the smaller bottom contact.

Figure 5:
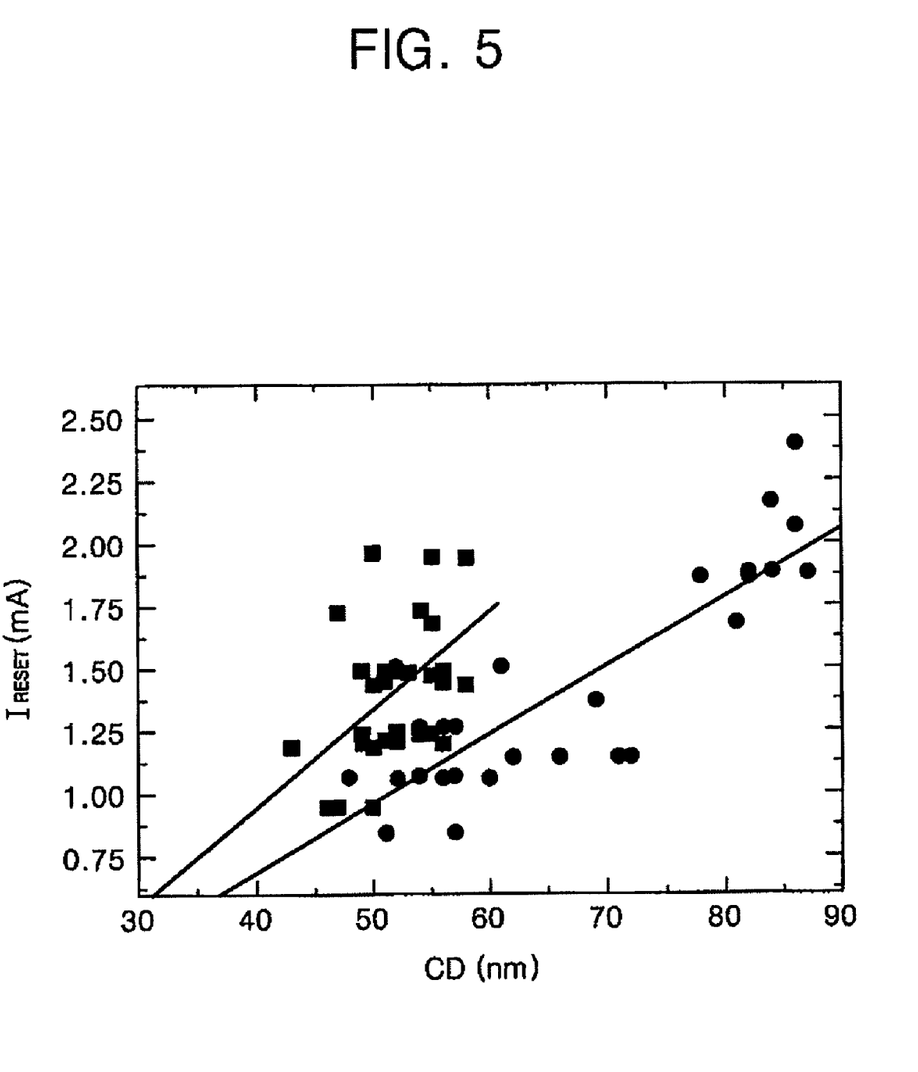
FIG. 5 contains a graph illustrating the dependency of the reset current $I_{RESET}$ on the diameter (CD) of the bottom contact of a PRAM memory cell, illustrating $1^{st}$-order regression.

FIG. 5 contains a graph illustrating the dependency of the reset current $I_{RESET}$ on the diameter (CD) of the bottom contact of a PRAM memory cell, illustrating 1$^{st}$-order regression. In the graph of FIG. 5, the squares illustrate the case of a bottom contact made of TiN, and the circles illustrate the case of a bottom contact made of TiAlN. The reset current $I_{RESET}$ is the current required to change the programming of the cell from the crystalline state to the amorphous state. As shown in FIG. 5, the decrease in ratio of $I_{RESET}$ with respect to bottom contact CD illustrates a 1$^{st}$-order regression. It is noted from the curve of FIG. 5 that the reset current-to-CD ratio for a TiN bottom contact is 38.9 uA/nm, and the ratio for a TiAlN bottom contact is 27.4 uA/nm. The reset current is 0.8 mA for a TiAlN bottom contact at 44 nm and for a TiN bottom contact at 36 nm.

Figure 6:
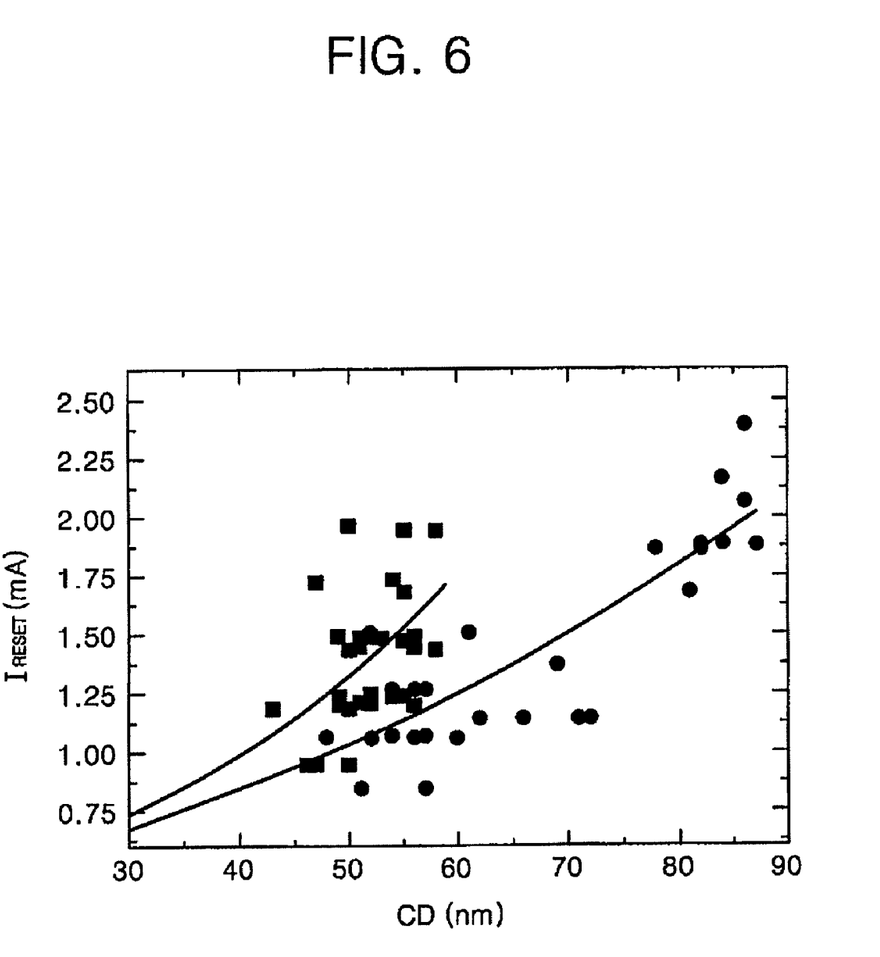
FIG. 6 contains a graph illustrating the dependency of the reset current $I_{RESET}$ on the diameter (CD) of the bottom contact of a PRAM memory cell, illustrating $2^{nd}$-order regression.

FIG. 6 contains a graph illustrating the dependency of the reset current $I_{RESET}$ on the diameter (CD) of the bottom contact of a PRAM memory cell, illustrating 2$^{nd}$-order regression, in which the reset current is proportional to the square of the diameter CD. In the graph of FIG. 6, the squares illustrate the case of a bottom contact made of TiN, and the circles illustrate the case of a bottom contact made of TiAlN. The reset current $I_{RESET}$ is the current required to change the programming of the cell from the crystalline state to the amorphous state. It is noted from the curve of FIG. 6 that the reset current is 0.8 mA for a TiAlN bottom contact at 39 nm and for a TiN bottom contact at 32 nm.

Figure 7:
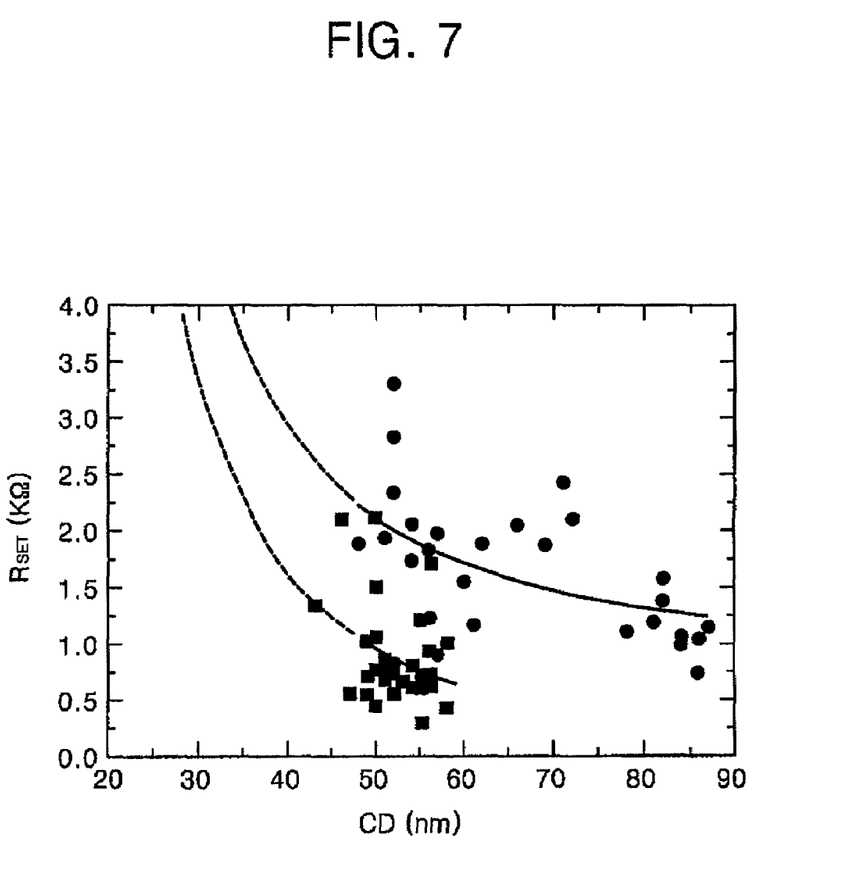
FIG. 7 contains a graph illustrating the dependency of the set resistance $R_{SET}$ on the diameter (CD) of the bottom contact of a PRAM memory cell, in which the set resistance is proportional to the square of the diameter CD.

FIG. 7 contains a graph illustrating the dependency of the set resistance $R_{SET}$ on the diameter (CD) of the bottom contact of a PRAM memory cell, in which the set resistance is proportional to the square of the diameter CD. In the graph of FIG. 7, the squares illustrate the case of a bottom contact made of TiN, and the circles illustrate the case of a bottom contact made of TiAlN. It is noted from the curve of FIG. 7 that the set resistance RSET is 2.5-3 kΩ for a TiAlN bottom contact and 2.2-2.9 kΩ for a TiN bottom contact and a reset current $I_{RESET}$ of 0.8 mA.

According to the invention, each PRAM memory cell can have multiple programmable volumes of phase change GST chalcogenide material which are independently programmable, such that each cell can store a plurality of bits of data. According to the invention, each programmable volume is connected to a respective contact. The resistance of each contact is controlled, such as by controlling its cross-sectional area, such that a programming current flowing through all of the contacts can independently program each programmable volume to a selected state.

Figure 8:
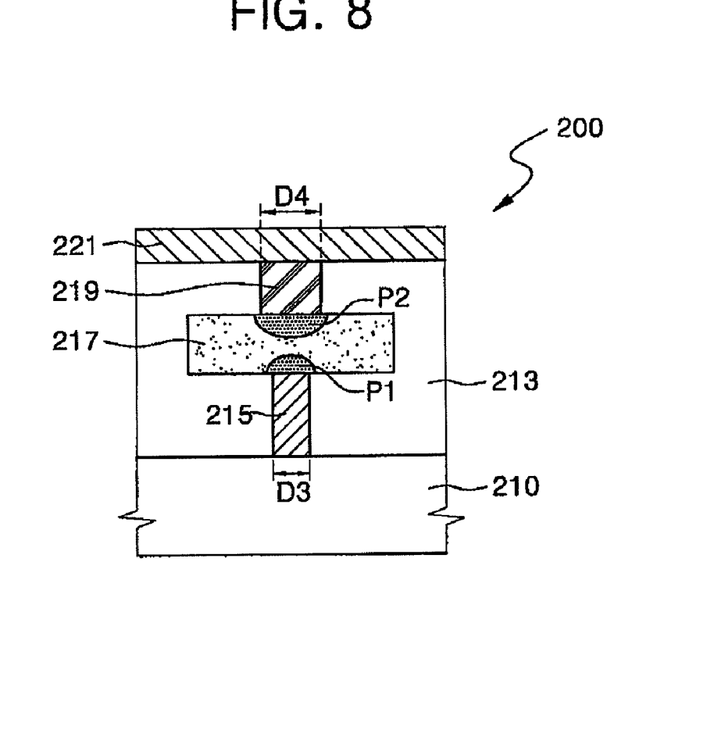
FIG. 8 is a schematic cross-sectional view of a multi-bit PRAM cell according to an embodiment of the invention.

FIG. 8 is a schematic cross-sectional view of a multi-bit PRAM cell 200 according to an embodiment of the invention. Referring to FIG. 8, the memory cell 200 includes a substrate 210 on which an insulating layer 213 is formed. A phase change GST material pattern 217 is formed in the insulating layer 213. A bottom contact 215 having a diameter D3 is formed in the insulating layer 213 in contact with the bottom surface of the phase change material pattern 217. The bottom contact 215 defines a first programmable volume P1 in the phase change material pattern 217. A top contact 219 having a diameter D4 is formed in the insulating layer 213 in contact with the top surface of the phase change material pattern 217. The top contact 219 defines a second programmable volume P2 in the phase change material pattern 217. A conductive plate line 221 is formed over the structure in contact with the top end of the top contact 219. According to the invention, the resistances of the two contacts 215 and 219 are independently controlled such that specific programming currents can be applied to independently program the programmable volumes P1 and P2 to desired states. When the resistances are different, the heat generated in the programmable volumes P1 and P2 is different, such that the programmable volumes P1 and P2 can be independently programmed. The control over the resistances of the contacts 215 and 219 can be accomplished by one or more means. For example, the diameters D3 and D4 can be made different such that the resistances of their respective contacts 215 and 219 are different. Also, the contacts 215 and 219 can be formed of different materials, such that their resistivities are different. For example, one of the contacts 215 and 219 can be made of TiAlN, and the other can be made of TiN. Also, a combination of different diameters D3 and D4 as well as different resistivities can be used to obtain the controlled difference in resistances. It should be noted that the diameters D3 and D4 of the contacts 215 and 219, whether they are the same or different, are typically less than 50 nm, such that they operate as heating elements.

Figure 9:
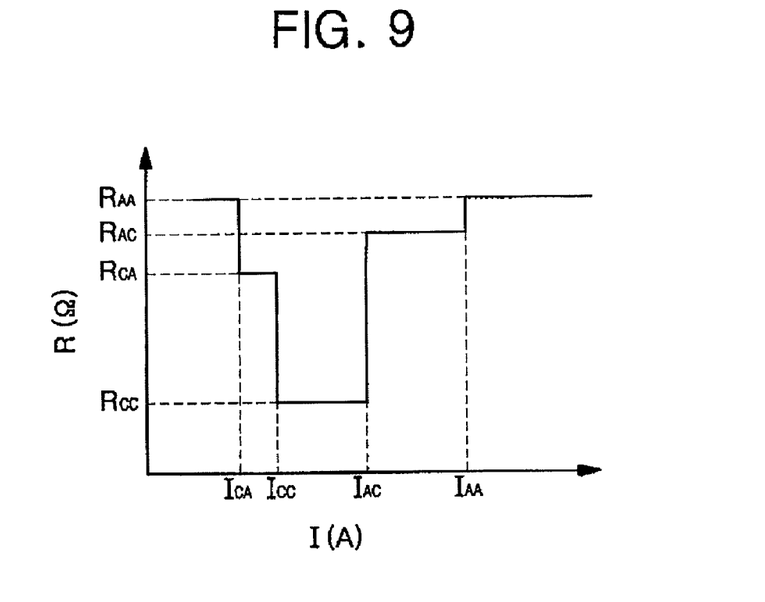
FIG. 9 contains a schematic waveform diagram illustrating the current-resistance (I-R) characteristics for the PRAM memory cell illustrated in FIG. 8.

FIG. 9 contains a schematic waveform diagram illustrating the current-resistance (I-R) characteristics for the PRAM memory cell 200 illustrated in FIG. 8. In the graph of FIG. 9, the references to the resistances R and to the currents I each contain two subscripts, either "A" or "C." These refer to the amorphous state or crystalline state of the two programmable volumes P1 and P2. Specifically, the first subscript refers to the state of the first programmable volume P1, and the second subscript refers to the state of the second programmable volume P2. The resistance $R_{AA}$ is the cell resistance with both programmable volumes P1 and P2 in the amorphous state. The current $I_{CA}$ is the programming current used to program the programmable volume P1 to the crystalline state while leaving the programmable volume P2 in the amorphous state, such that the resistance of the cell becomes $R_{CA}$. The current $I_{CC}$ is the programming current used to program the cell such that both programmable volumes P1 and P2 are in the crystalline state, such that the resistance of the cell becomes $R_{CC}$. The current $I_{AC}$ is the programming current used to program the cell such that the programmable volume P1 returns to the amorphous state while the programmable volume P2 remains in the crystalline state, such that the resistance of the cell becomes $R_{AC}$. The current $I_{AA}$ is the programming current used to program the cell such that both programmable volumes P1 and P2 return to the amorphous state, such that the resistance of the cell becomes $R_{AA}$. Because of the different resistances of the two contacts 215 and 219, the cell can be programmed to one of four possible resistances. Hence, the cell is a multi-bit cell which can store four possible values or two bits of data per chalcogenide element.

Figure 10:
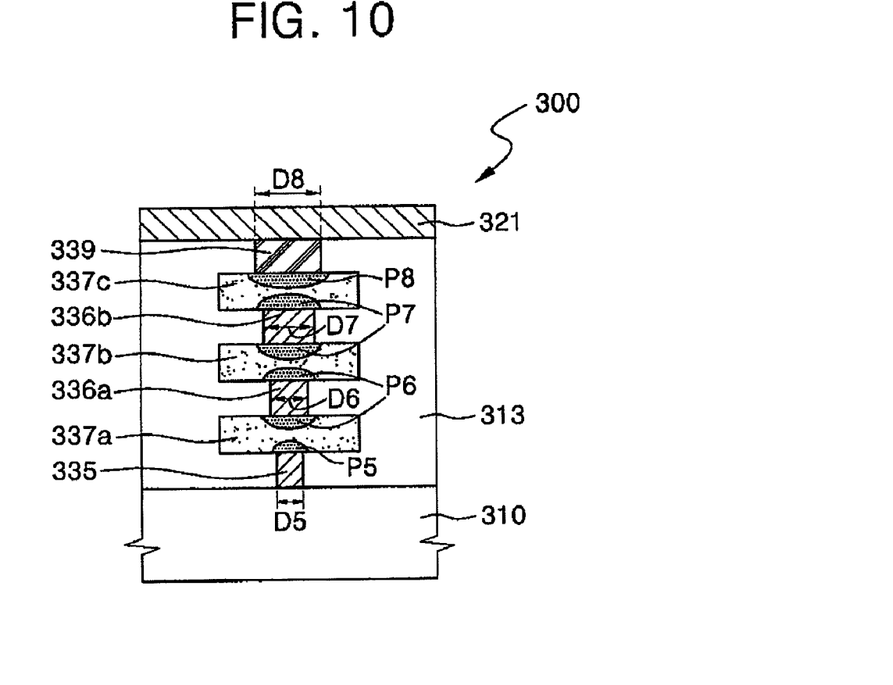
FIG. 10 contains a schematic cross-sectional view of a multi-bit PRAM cell according to another embodiment of the invention.

FIG. 10 contains a schematic cross-sectional view of a multi-bit PRAM cell 300 according to another embodiment of the invention. Referring to FIG. 10, the memory cell 300 includes a substrate 310 on which an insulating layer 313 is formed. In the illustrated embodiment, three phase change GST material patterns 337a, 337b and 337c are formed in the insulating layer 313. A bottom contact 335 having a diameter D5 is formed in the insulating layer 313 in contact with the bottom surface of the bottom phase change material pattern 337a. The bottom contact 335 defines a programmable volume P5 in the bottom phase change material pattern 337a. A top contact 339 having a diameter D8 is formed in the insulating layer 313 in contact with the top surface of the top phase change material pattern 337c. The top contact 339 defines a programmable volume P8 in the top phase change material pattern 337c. A contact 336a having a diameter D6 is connected between the bottom phase change material pattern 337a and the middle phase change material pattern 337b. The top end of the contact 336a defines a programmable volume P6 in the middle phase change material pattern 337b, and the bottom end of the contact 336a defines a programmable volume P6 in the bottom phase change material pattern 337a. A contact 336b having a diameter D7 is connected between the top phase change material pattern 337c and the middle phase change material pattern 337b. The bottom end of the contact 336b defines a programmable volume P7 in the middle phase change material pattern 337b, and the top end of the contact 336b defines a programmable volume P7 in the top phase change material pattern 337c. A conductive plate line 321 is formed over the structure in contact with the top end of the top contact 339.

In accordance with the invention, the resistances of the contacts are controlled such that the programming of the multiple programmable volumes can be controlled. In one embodiment, the diameters D5, D6, D7 and D8 can be different such that their respective contacts have different resistances. Alternatively, the contacts can be made with different materials having different resistivities. These two approaches can also be used in combination with any combination of the contacts. By controlling the resistances of the contacts, the programmable volumes can be independently programmed to different states. As in the previously described embodiment, the diameters D5, D6, D7 and D8 are all preferably less than 50 nm such that their respective contacts perform as heating elements. It is noted that, in the embodiment, of FIG. 10, the contacts 336a and 336b are substantially cylindrical such that each defines a programmable volume of the same size in both of the phase change material patterns they contact. That is, contact 336a defines two similar programmable volumes P6 in phase change material patterns 337a and 337b, and contact 336b defines two similar programmable volumes P7 in phase change material patterns 337b and 337c.

Figure 11:
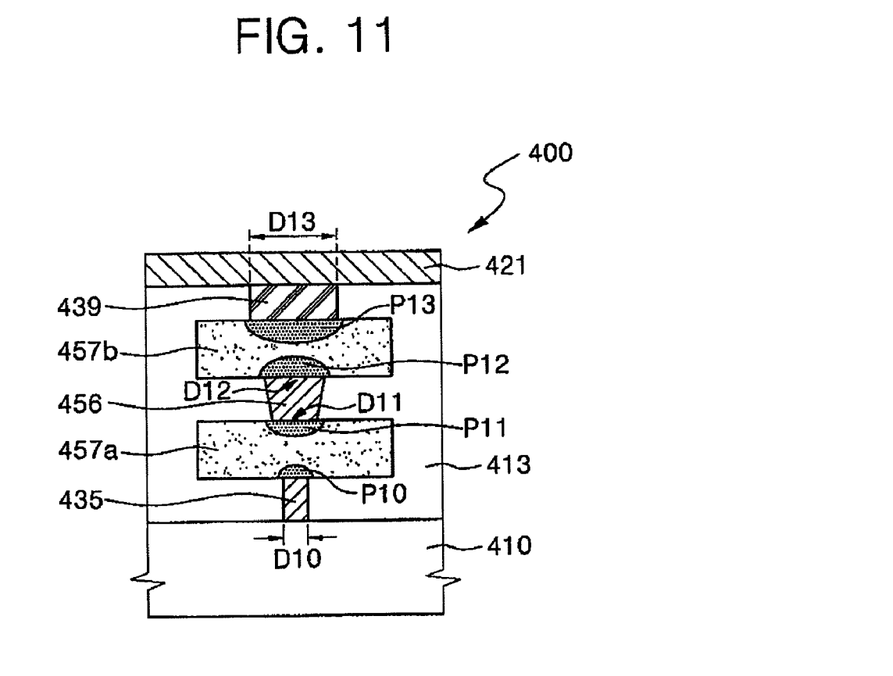
FIG. 11 contains a schematic cross-sectional view of a multi-bit PRAM cell according to another embodiment of the invention.

FIG. 11 contains a schematic cross-sectional view of a multi-bit PRAM cell 400 according to another embodiment of the invention. Referring to FIG. 11, the memory cell 400 includes a substrate 410 on which an insulating layer 413 is formed. In the illustrated embodiment, two phase change GST material patterns 457a and 457b are formed in the insulating layer 413. A bottom contact 435 having a diameter D10 is formed in the insulating layer 413 in contact with the bottom surface of the bottom phase change material pattern 457a. The bottom contact 435 defines a programmable volume P10 in the bottom phase change material pattern 457a. A top contact 439 having a diameter D13 is formed in the insulating layer 413 in contact with the top surface of the top phase change material pattern 457b. The top contact 439 defines a programmable volume P13 in the top phase change material pattern 457b. A contact 456 having a tapered shape which defines two diameters D11 and D12 is connected between the bottom phase change material pattern 457a and the top phase change material pattern 457b. The top end of the tapered contact 456 defines a programmable volume P12 in the top phase change material pattern 457b, and the bottom end of the tapered contact 456 defines a programmable volume P11 in the bottom phase change material pattern 457a. Because the diameter D12 of the tapered contact 456 is different than the diameter D11 of the tapered contact 456, two different and independently programmable volumes P12 and P11 are defined in the two phase change material patterns 457a and 457b. A conductive plate line 321 is formed over the structure in contact with the top end of the top contact 339.

According to the invention, the resistances of the contacts are independently controlled such that specific programming currents can be applied to independently program the programmable volumes to desired states. The control over the resistances of the contacts can be accomplished by one or more means. For example, the diameters can be made different such that the resistances of their respective contacts are different. Also, the contacts can be formed of different materials, such that their resistivities are different. Also, a combination of different diameters as well as different resistivities can be used to obtain the controlled difference in resistances. It should be noted that the diameters of the contacts, whether they are the same or different, are typically less than 50 nm, such that they operate as heating elements.

Figure 12:
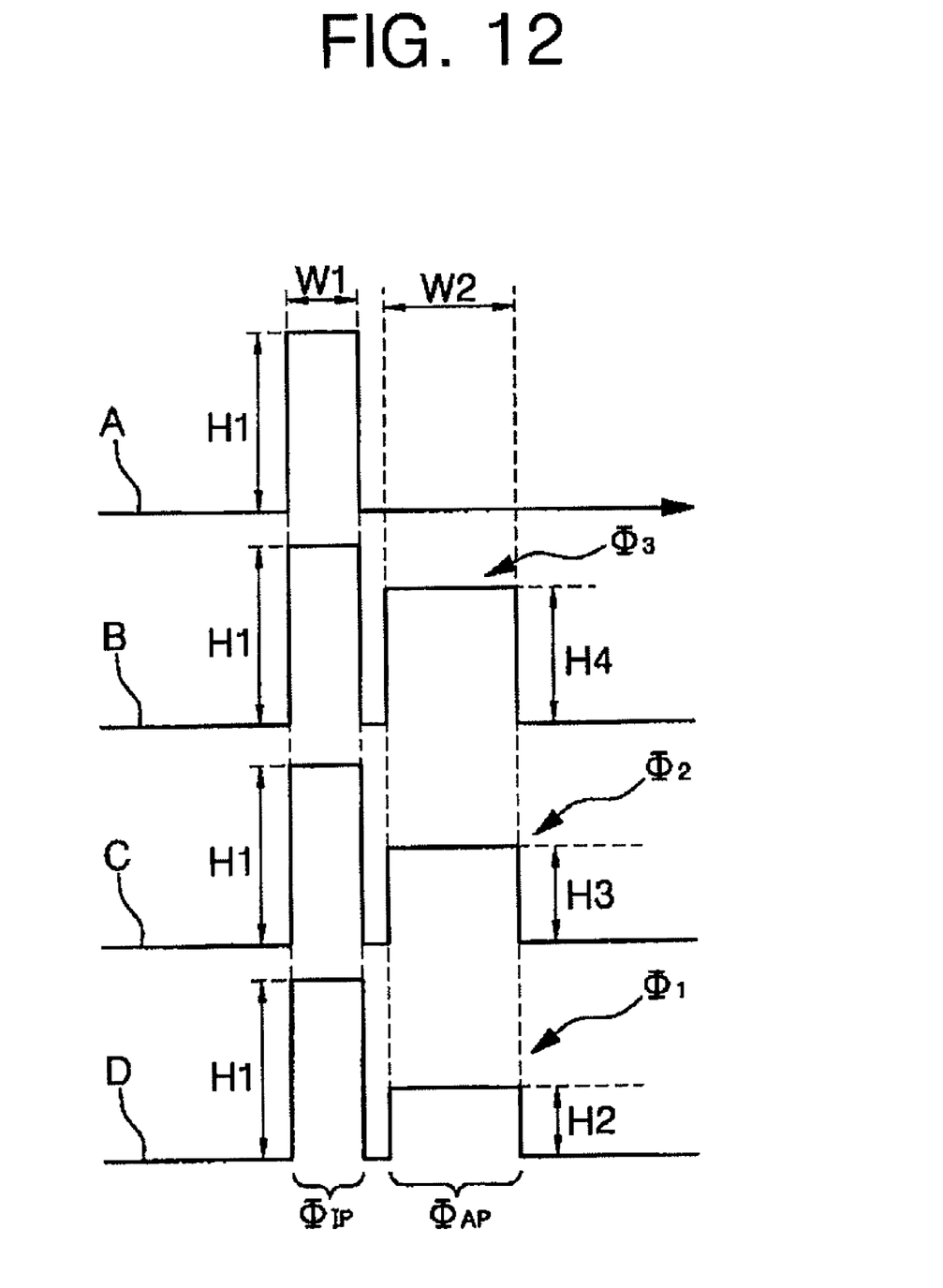
FIG. 12 contains a schematic timing diagram illustrating the timing of programming the multi-bit PRAM cell according to an embodiment of the invention, such as the embodiment of the invention shown in FIG. 8.

FIG. 12 contains a schematic timing diagram illustrating the timing of programming the multi-bit PRAM cell according to an embodiment of the invention, such as the embodiment of the invention shown in FIG. 8. As noted above, FIG. 9 contains a schematic waveform diagram illustrating the current-resistance (I-R) characteristics for the PRAM memory cell according to an embodiment of the invention. Referring to FIGS. 8, 9 and 12, in one embodiment, programming the device involves first applying an initial programming current pulse $\Phi_{IP}$ at an initial current magnitude of H1. This initial programming pulse $\Phi_{IP}$ is used to program both programmable volumes P1 and P2 to the amorphous state such that the cell resistance is in the $R_{AA}$ state. The current magnitude H1 is defined as $I_{AA}$. The programming pulse is indicated as having a width in time of W1. That time includes the current pulse itself as well as a relatively short quenching time of a few nanoseconds to allow both programmable volumes to reach the amorphous state.

The waveforms labeled A, B, C and D in FIG. 12 show the programming process according to the desired final state of the cell. For example, curve A illustrates the programming process if the desired final state is $R_{AA}$, in which both programmable volumes are programmed to the amorphous state. In this case, the programming process is complete after application of the initial programming pulse $\Phi_{IP}$. Curve B illustrates the programming process if the desired final state is $R_{AC}$, in which the programmable volume P1 is in the amorphous state and the programmable volume P2 is in the crystalline state. Curve C illustrates the programming process if the desired final state is $R_{CC}$, in which the programmable volumes P1 and P2 are both in the crystalline state. Curve D illustrates the programming process if the desired final state is $R_{CA}$, in which the programmable volume P1 is in the crystalline state and the programmable volume P2 is in the amorphous state. In each of processes B, C and D, an additional programming pulse $\Phi_{AP}$ is applied after the initial programming pulse $\Phi_{IP}$ to program the cell from the $R_{AA}$ state to the desired final state.

Referring to Curve B of FIG. 12 and FIG. 9, the additional programming pulse labeled $\Phi_3$ is applied at a magnitude of H4, defined as $I_{AC}$, between H1 and H3 described herein. The current is in a range between about IAC and IAA to ensure proper programming of the programmable volumes P1 and P2, i.e., to ensure that P1 remains in the amorphous state and P2 transitions to the crystalline state. The additional programming pulse is active for a time period W2, which includes the actual current pulse duration and the relatively long quenching time required to allow P2 to enter the crystalline state.

Referring to Curve C of FIG. 12 and FIG. 9, the additional programming pulse labeled $\Phi_2$ is applied at a magnitude of H3, defined as $I_{CC}$, greater than H2 described herein. The current is in a range between about $I_{CC}$ and $I_{AC}$ to ensure proper programming of the programmable volumes P1 and P2, i.e., to ensure that both P1 and P2 transition to the crystalline state. The additional programming pulse is active for a time period W2, which includes the actual current pulse duration and the relatively long quenching time required to allow P1 and P2 to enter the crystalline state.

Referring to Curve D of FIG. 12 and FIG. 9, the additional programming pulse labeled is applied at a magnitude of H2, defined as $I_{CA}$. The current is in a range between about $I_{CA}$ and $I_{CC}$ to ensure proper programming of the programmable volumes P1 and P2, i.e., to ensure P1 transitions to the crystalline state and P2 remains in the amorphous state. The additional programming pulse is active for a time period W2, which includes the actual current pulse duration and the relatively long quenching time required to allow P1 to enter the crystalline state.

According to the invention, by providing a phase change material pattern with a plurality of independently programmable volumes, a multi-bit PRAM device, which can be readily fabricated, is provided.

It should be noted that in the foregoing description, heating contacts used to program programmable volumes in chalcogenide phase change material patterns are described as being circular in cross-section. It should be noted that the invention is applicable to contacts having any shape, including but not limited to contacts that are circular, rectangular, or other shape, in cross-section.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A phase-change random-access memory (PRAM) device, comprising:
   a first contact on a substrate, the first contact having a first cross-sectional area;
   a first phase change material on the first contact, the first phase change material having a first region in contact with the first contact;
   a second contact on the first phase change material, the second contact having a second cross-sectional area wider than the first cross-sectional area, the first phase change material having a second region being in contact with the second contact,
   wherein the second region is larger than the first region;
   wherein the first phase change material has a first programmable volume connected to the first region and a second programmable volume connected to the second region; and
   a second phase change material on the second contact, the second phase change material having a third region in contact with the second contact, the third region being the same size as the second region,
   wherein the second phase change material has a third programmable volume connected to the third region, and
   wherein the second cross-sectional area is narrower than a top surface of the first phase change material.

2. The PRAM device of claim 1, wherein a resistivity of a material of which the first contact is formed is different from that of a material of which the second contact is formed.

3. The PRAM device of claim 1, wherein a resistivity of a material of which the first contact is formed is substantially the same as a material of which the second contact is formed.

4. The PRAM device of claim 1, wherein the first and second contacts are made of different materials.

5. The PRAM device of claim 1, wherein the first and second contacts are made of substantially the same materials.

6. The PRAM device of claim 1, wherein a state of the second programmable volume is programmable according to the resistance associated with the second contact connected to the third region.

7. The PRAM device of claim 6, wherein a resistivity of a material of which the first contact is formed is different from that of a material of which the second contact is formed.

8. The PRAM device of claim 6, wherein the first and second contacts are made of different materials.

9. The PRAM device of claim 6, wherein at least one of the first and second contacts has more than one cross-sectional area.

10. The PRAM device of claim 1, wherein a resistivity of a material of which the first contact is formed is different from that of a material from which the second contact is formed.

11. The PRAM device of claim 1, wherein the first and second contacts are made of different materials.

12. The PRAM device of claim 1, further comprising a third contact having a third cross-sectional area and being connected to a fourth region of the second phase change material, the second phase change material comprising a fourth programmable volume connected to the fourth region.

13. The PRAM device of claim 12, wherein the third cross-sectional area is wider than the second cross-sectional area.

14. The PRAM device of claim 12, wherein a resistivity of a material of which the third contact is formed is different from that of a material of which at least one of the first and second contacts is formed.

15. The PRAM device of claim 12, wherein the third contact and at least one of the first and second contacts are made of different materials.

16. The PRAM device of claim 1, wherein the third cross-sectional area is narrower than a top surface of the second phase change material.

17. The PRAM device of claim 12, further comprising a third phase change material on the third contact, the third phase change material having a fifth region in contact with the third contact, the fifth region being the same size as the fourth region.

18. The PRAM device of claim 1, wherein the first cross sectional area is narrower than a bottom surface of the first phase change material.

19. The PRAM device of claim 1, wherein the second cross-sectional area is narrower than a bottom surface of the second phase change material.

* * * * *